US005550086A

United States Patent [19]
Tai

[11] Patent Number: 5,550,086
[45] Date of Patent: Aug. 27, 1996

[54] CERAMIC CHIP FORM SEMICONDUCTOR DIODE FABRICATION METHOD

[76] Inventor: George Tai, 2F, NO. 8, Alley 14, Lane 121, Ching-Hua St., Taipei, Taiwan

[21] Appl. No.: 578,194

[22] Filed: Dec. 27, 1995

[51] Int. Cl.$^6$ .................................................. H01L 21/60
[52] U.S. Cl. ........................ 437/209; 437/211; 437/214; 437/217; 437/906
[58] Field of Search .................................. 437/209, 210, 437/211, 212, 213, 214, 215, 216, 217, 218, 219, 906, 905, 906

[56] References Cited

U.S. PATENT DOCUMENTS

| | | | |
|---|---|---|---|
| 3,237,272 | 3/1966 | Kallander | 437/209 |
| 3,487,541 | 1/1970 | Boswell | 437/209 |
| 3,691,628 | 9/1972 | Kim et al. | 437/209 |
| 4,540,603 | 9/1985 | Hidaka et al. | 437/209 |
| 4,942,139 | 7/1990 | Korwin-Pawlowski | 437/209 |
| 5,019,535 | 5/1991 | Wosnarowski et al. | 437/209 |
| 5,048,179 | 9/1991 | Shindo et al. | 437/209 |
| 5,166,098 | 11/1992 | Mick et al. | 437/219 |
| 5,337,216 | 8/1994 | McIver | 437/219 |

*Primary Examiner*—Kevin M. Picardat
*Attorney, Agent, or Firm*—Morton J. Rosenberg; David I. Klein

[57] ABSTRACT

A ceramic chip form semiconductor diode fabrication method including the steps of:

i) making a plate-like ceramic body element having a diode die mounting site, then covering a conductive layer on the body element for processing into conductor elements;

ii) attaching a diode die to said diode die mounting site, then applying a glass powder paste in the gap between said diode die mounting site and said diode die, and then heat processing said glass powder paste into a glass joint;

iii) processing the conductive layer into two conductor elements at two opposite electrode surfaces of the diode die, permitting the conductor elements to be respectively extended to two opposite ends of the body element to form a respective terminal for external connection; and iv) covering an over glaze over the diode die and the conductor elements to finish the package.

6 Claims, 3 Drawing Sheets

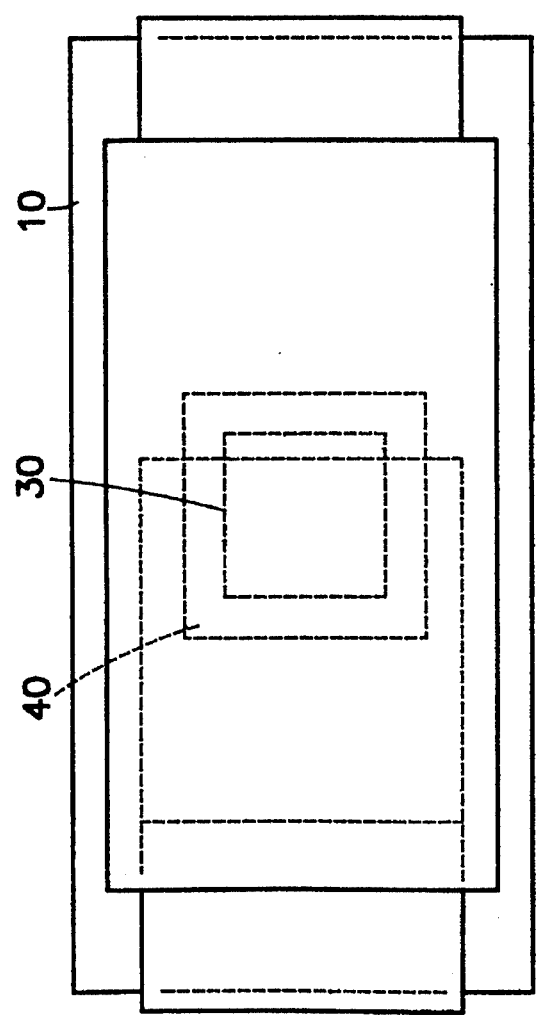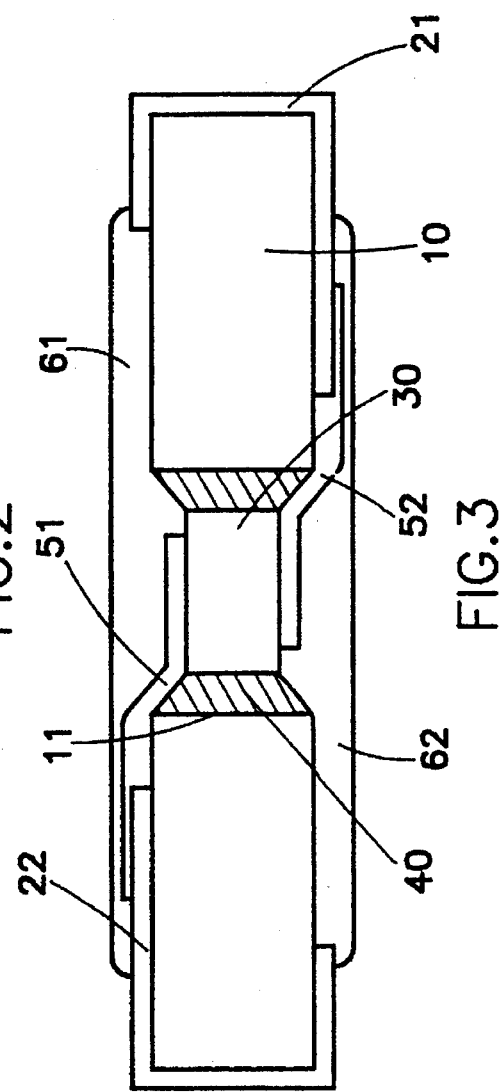

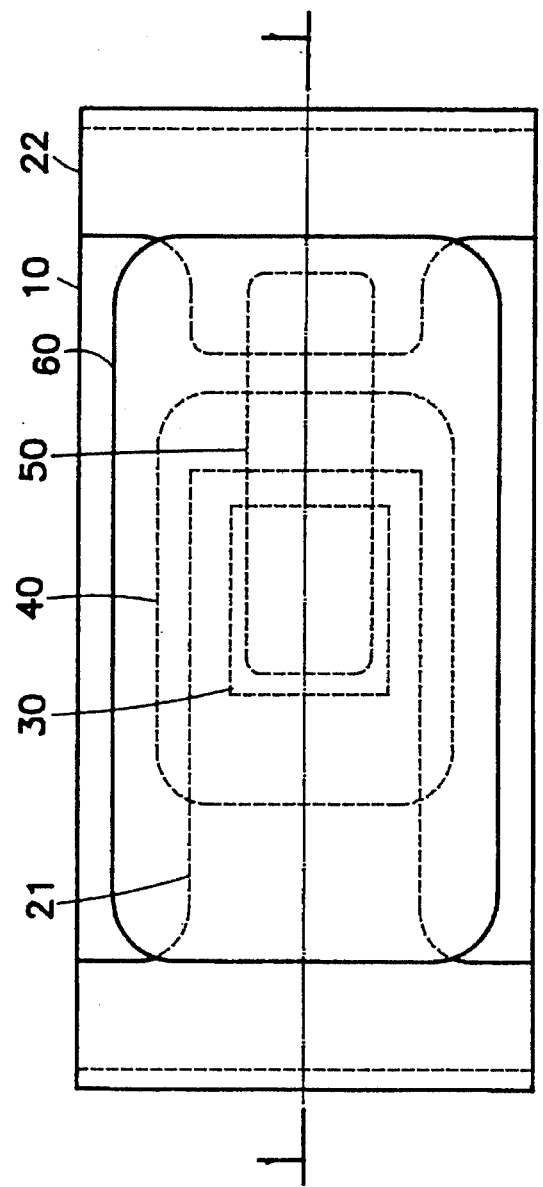
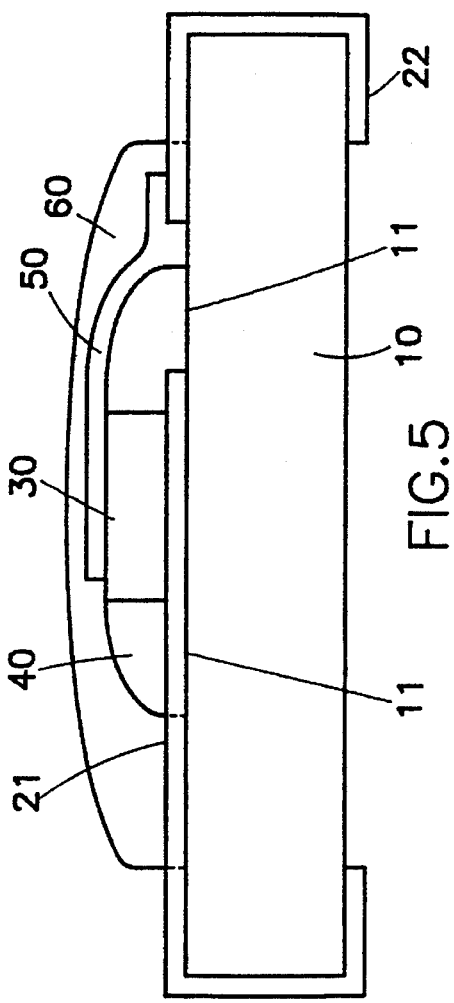
FIG.4
FIG.5

CERAMIC CHIP FORM SEMICONDUCTOR DIODE FABRICATION METHOD

BACKGROUND OF THE INVENTION

The present invention relates to a semiconductor diode fabrication method for the fabrication of a type of chip form outline package with main packaging element of ceramic material. And the semiconductor diode die; metal conductors and encapsulation glass are in a cavity-free structure. The ceramic body element can be prepared in a connected multi-element plate form. The glass joint, conductor elements, and over glaze can be made by thick film printing and firing.

Regular semiconductor diode package methods generally include three types, namely, the metal or glass ceramics container package, the plastic molding package, and the glass powder slurry spin-coating and vitrification package. According to the metal or glass ceramics container package, the two opposite electrode surfaces of the diode die, after the formation of the sub-assembly, are fastened to the conductive elements by soft soldering or hard brazing. This method does not achieve a cavity free structure. According to the plastic molding package, the two opposite electrode surfaces of the diode die are connected to the conductor elements by soft soldering or hard brazing, and then encapsulated with plastics. This method achieves a cavity free structure. However, because the insulative body element is made after the diode die and the conductors are welded together into a sub-assembly, ceramics and the like which is to be processed at a high temperature cannot be used for this method. According to the glass powder slurry spin-coating and vitrification package, the diode die is connected to the electrode elements by hard brazing at a high temperature to form a sub-assembly, and then the sub-assembly is covered with a layer of glass powder paste and then fired to form a bead form glass encapsulation element, in which the electrode elements are made from molybdenum or tungsten which has a coefficient of thermal expansion close to that of the silicon diode die. However, a semiconductor diode made according to this glass powder slurry spin-coating and vitrification package is of bead form which is not convenient in use. Furthermore, the use of molybdenum or tungsten greatly complicates the manufacturing process, and relatively increases the manufacturing cost.

SUMMARY OF THE INVENTION

It is one object of the present invention to provide a ceramic chip form semiconductor diode fabrication method which eliminates the aforesaid drawbacks. It is another object of the present invention to provide a ceramic chip form semiconductor diode fabrication method which is practical for the production of full chip form outline semiconductor diodes having pad terminals instead of extrusive terminals to fit SMT (surface mounting technology). It is still another object of the present invention to provide a ceramic chip form semiconductor diode fabrication method which is economic to perform. It is still another object of the present invention to provide a ceramic chip form semiconductor diode fabrication method which permits the body element to be made in the form of a connected multi-unit form. It is still another object of the present invention to provide a ceramic chip form semiconductor diode fabrication method which allows the conductor elements and the over glaze; the encapsulation glass to be made in a cavity free structure by thick film printing and firing.

According to the present invention, a body element is made from a ceramic plate, then the glass joint and the conductor elements are made on the body element after the installation of the diode die to form a cavity free structure, when the conductor elements and the diode die and the body element are electrically connected together, an over glaze is covered on the outside to finish the product.

The present invention achieves the following advantages:

1) It is suitable for fully automatic production, and therefore the manufacturing cost can be greatly reduced.
2) Because the coefficients of thermal expansion of ceramic substrate and glass are well matched with the diode die, high reliability is achieved, furthermore the ceramic substrate provides satisfactory insulation, high mechanical strength, and high thermal conductivity.
3) Because several hundreds or thousands of diode elements can be made on one multi-unit ceramic substrate plate, semiconductor diodes can be made lot by lot efficiently.
4) The materials can be easily obtained, and the related elements can be easily and inexpensively made.
5) The plate-like structure permits the semiconductor diode to be made smaller than conventional designs.

BRIEF DESCRIPTION OF THE DRAWINGS

FIG. 2 is a top view of a ceramic chip form semiconductor diode according to the present invention;

FIG. 3 is a cross-sectional side view of the ceramic chip form semiconductor diode of FIG. 2;

FIG. 4 is a top view of an alternate form of the ceramic chip form semiconductor diode according to the present invention; and FIG. 5 is a cross-sectional side view of the ceramic chip form semiconductor diode of FIG. 4.

DETAILED DESCRIPTION OF THE PREFERRED EMBODIMENT

Figure 1:
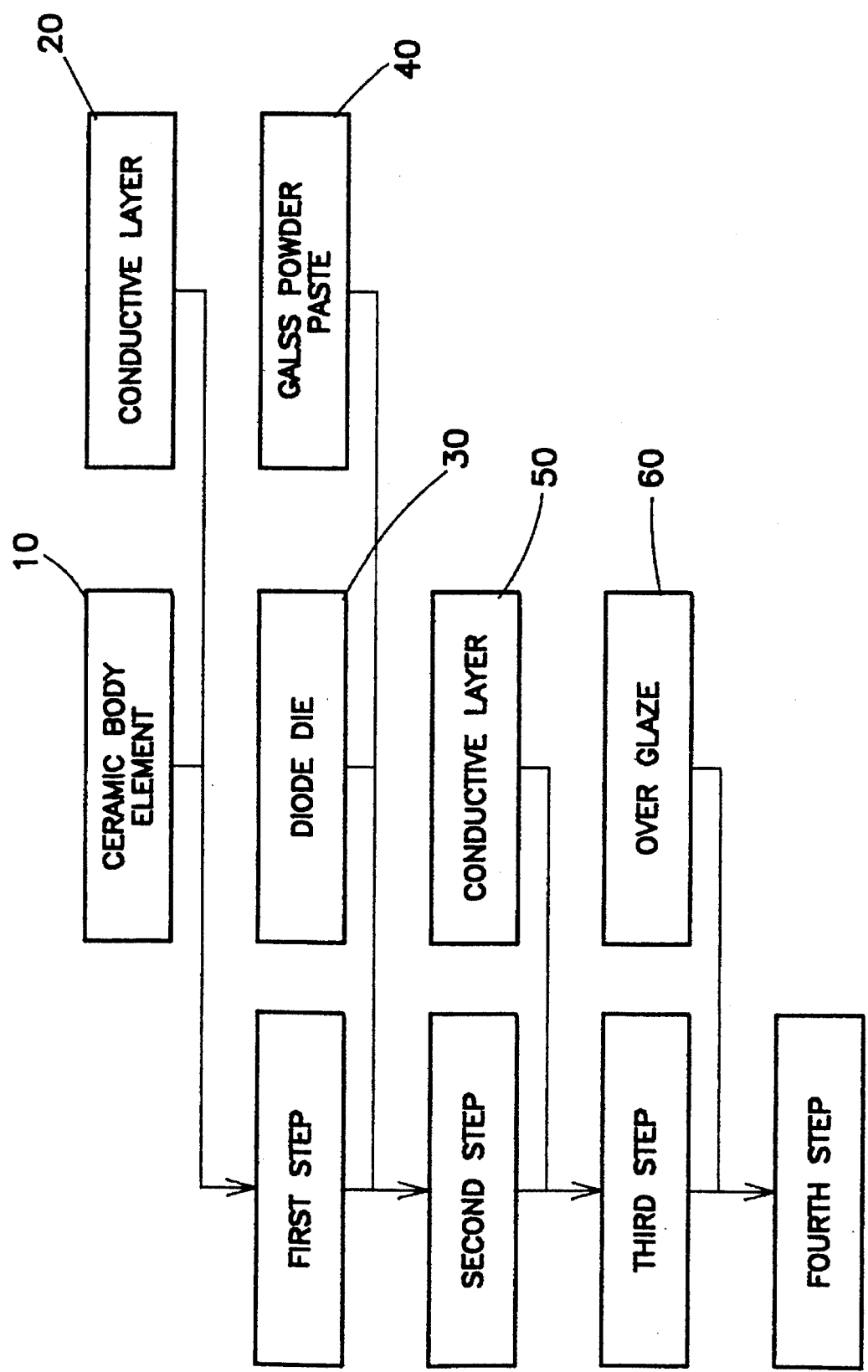
FIG. 1 is a flow chart illustrating the package process according to the present invention.

Referring to FIG. 1, the method of fabricating a ceramic chip form semiconductor diode in accordance with the present invention includes the steps of:

i) making a plate-like ceramic body element 10 having a diode die mounting site, which can be a plane or a wall portion with a through hole on the body element, then covering a conductive layer 20 on the surface of the body element 10 by thick film printing and firing, vacuum sputtering coating, vacuum evaporation coating, or electrical plating;

ii) fastening a diode die 30 to the diode die mounting site of the body element 10, then applying a glass powder paste in the gap between the diode die mounting site and the diode die 30, and then putting the body element 10 with the diode die 30 in an electric furnace to sinter the glass powder paste into a glass joint;

iii) processing the conductive layer 20 into a conductor element 50 (see FIG. 5) or conductor elements 51 and 52 (see FIG. 3) between the electrode side of the diode die and the terminal; and iv) covering an over glaze 60 over the positioning portions of the body element 10 and the conductor elements to finish the package.

FIGS. 2 and 3 show a full chip outline type semiconductor diode according to the present invention. As illustrated, this full chip outline type semiconductor diode comprises a ceramic plate body element 10, first layer of conductor elements 21 and 22 on the body element 10, a diode die mounting site 11 on the body element 10, a diode die 30 fastened to the diode die mounting site 11, a glass powder paste 40 applied in the gap between the diode die 30 and the diode die mounting site 11, a second layer of conductor elements 51 and 52 mounted on two opposite electrode surfaces of the diode die 30 and respectively connected to the first layer of conductor elements 21 and 22, and a layer of over glaze 61 and 62 respectively covered on the second layer of conductor elements 51 and 52 and the diode die mounting site 11.

FIGS. 4 and 5 show an alternate form of the full chip outline type semiconductor diode according to the present invention. As illustrated, the full chip outline type semiconductor diode comprises a ceramic plate body element 10, a first layer of conductor elements 21 and 22 mounted on the body element 10, a diode die mounting site 11 on the body element 10, a diode die 30 mounted on the first layer of conductor elements 21 and 22, a glass powder paste applied in between the surfaces of the diode die 30 other than two electrode surfaces and the diode die mounting site 11, a second layer of conductor element 50 made on the electrode surface of diode die 30 and connected to the first layer of conductor element 22, and an over glaze 60 covered over the first layer of conductor elements 21 and 22, the diode die 30, and the second layer of conductor element 50.

As indicated, a ceramic chip form semiconductor diode in accordance with the present invention is made from fine ceramics in the shape of a flat plate or a flat plate with die mounting hole, or of any of a variety of shapes. Fine ceramics can be obtained from high strength aluminum oxide or high thermal conductive aluminum nitride ceramics, or any suitable ceramic materials.

It is to be understood that the drawings are designed for purposes of illustration only, and are not intended as a definition of the limits and scope of the invention disclosed.

I claim:

1. A ceramic chip form semiconductor diode fabrication method including the steps of:

i) making a plate-like ceramic body element having a diode die mounting site, then covering a conductive layer on said body element to form conductor elements permitting said conductor elements to be respectively extended to two opposite ends of said body element to form a respective terminal for external connection;

ii) attaching a diode die to said diode die mounting site, then applying a glass powder paste in the gap between said diode die mounting site and said diode die, and then heat processing said glass powder paste into a glass joint;

iii) covering conductive layer to connect conductor element(s) and electrode surface(s) of said diode die; and iv) covering an over glaze over said diode die and said conductor elements to finish the package.

2. The ceramic chip form semiconductor diode fabrication method of claim 1 wherein said body element is obtained from a connected multi-unit form.

3. The ceramic chip form semiconductor diode fabrication method of claim 1 wherein said diode die mounting site is a plane on said body element.

4. The ceramic chip form semiconductor diode fabrication method of claim 1 wherein said diode die mounting site is a wall portion of a through hole in said body element.

5. The ceramic chip form semiconductor diode fabrication method of claim 1 wherein said conductor elements are made before the formation of said glass joint by thick film printing and firing, vacuum sputtering coating, vacuum evaporation coating, or chemical plating.

6. The ceramic chip form semiconductor diode fabrication method of claim 1 wherein said glass joint and cover glaze are made by thick film printing and firing.

* * * * *